United States Patent
Shigaki et al.

(10) Patent No.: US 6,377,118 B1
(45) Date of Patent: Apr. 23, 2002

(54) LINEARIZER FOR POWER AMPLIFIER

(75) Inventors: Masafumi Shigaki; Takao Sasaki, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/385,721

(22) Filed: Aug. 30, 1999

(30) Foreign Application Priority Data

Feb. 1, 1999 (JP) .............................. 11-023405

(51) Int. Cl.⁷ .............................. H03F 1/26; H03F 3/16
(52) U.S. Cl. .......................................... 330/149; 330/277
(58) Field of Search .............................. 330/149, 277, 330/296, 285

(56) References Cited

U.S. PATENT DOCUMENTS

| | | | | |
|---|---|---|---|---|
| 4,564,816 A | * | 1/1986 | Kumar et al. | 330/149 |
| 5,221,908 A | * | 6/1993 | Katz et al. | 330/149 |
| 5,568,087 A | * | 10/1996 | Gatti | 330/149 |
| 5,990,745 A | * | 11/1999 | Carroll | 330/277 |
| 5,994,963 A | * | 11/1999 | Kawai et al. | 330/277 |

FOREIGN PATENT DOCUMENTS

JP 57-101404 6/1982

OTHER PUBLICATIONS

Schilling, Donald L. and Belove, Charles, *Electronic Circuits Discrete and Integrated*, 2nd ed., 1979, pp. 278–280.*

* cited by examiner

Primary Examiner—Steven J. Mottola
(74) Attorney, Agent, or Firm—Rosenman & Colin LLP

(57) ABSTRACT

A linearizer includes an input terminal, an output terminal, and a field-effect transistor having a gate connected to the input terminal, a drain connected to the output terminal and a source grounded. A supply voltage is supplied through a load circuit to the drain of the transistor. A gate voltage is supplied through a bias line to the gate of the transistor. The transistor is biased at a bias point at which a drain current of the transistor in response to the gate voltage is in an unsaturated region.

9 Claims, 13 Drawing Sheets

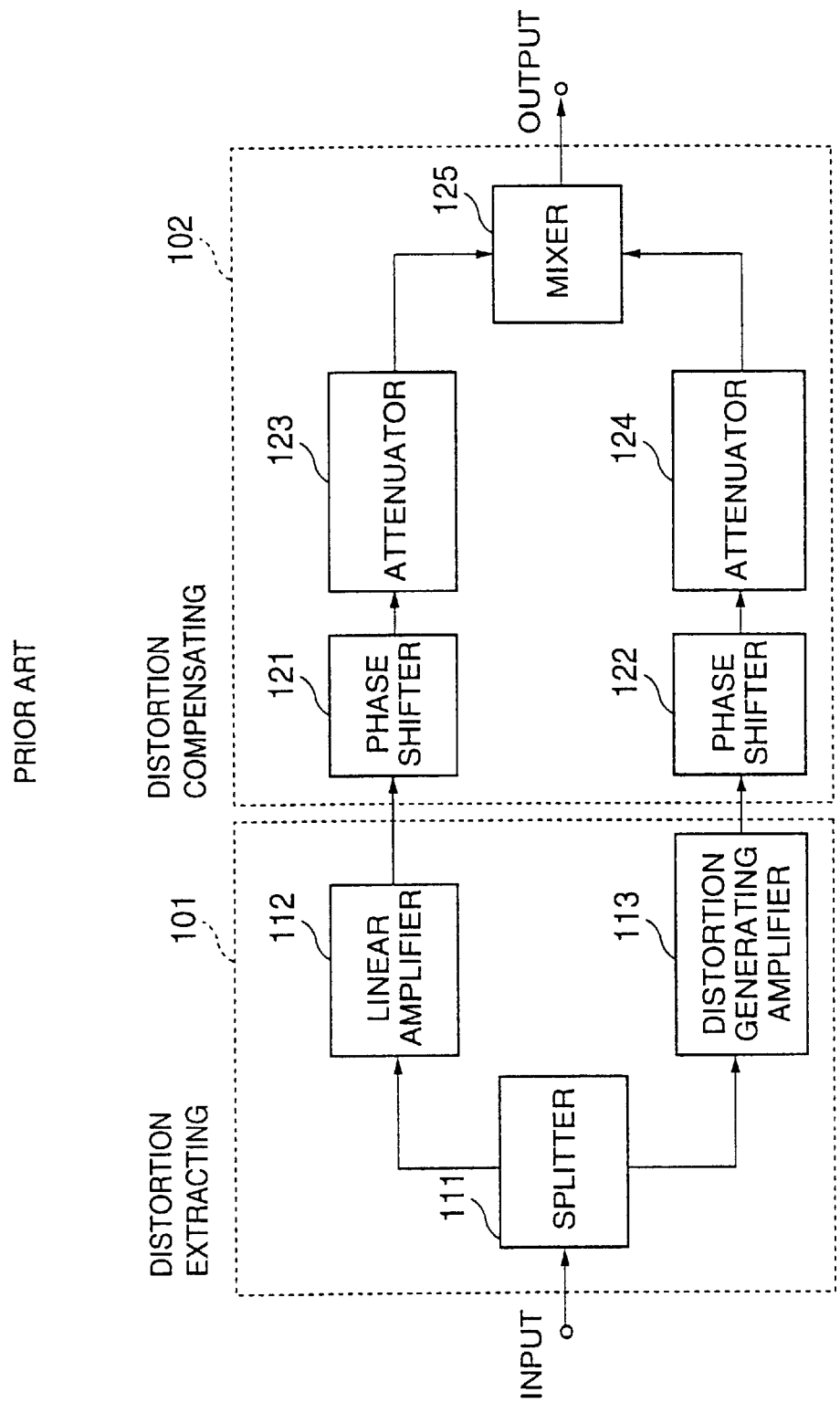

FIG.15A
FIG.15B
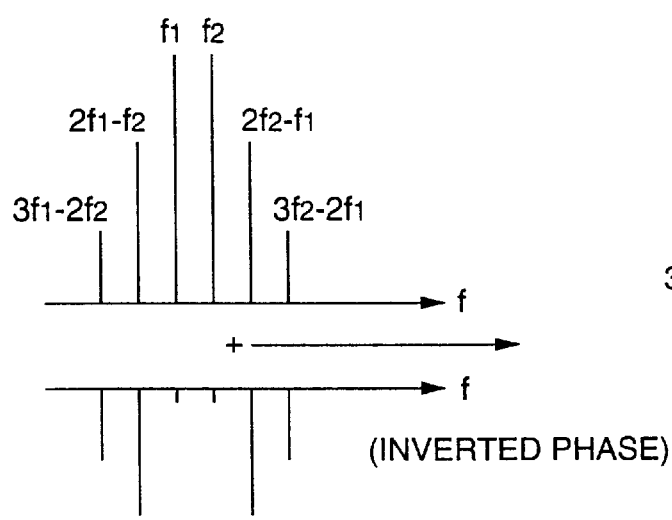
(INVERTED PHASE)
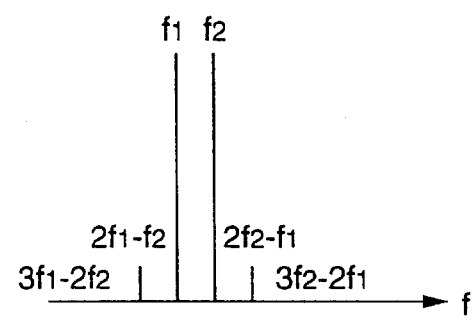

LINEARIZER FOR POWER AMPLIFIER

BACKGROUND OF THE INVENTION (1) Field of the Invention

The present invention relates to a linearizer for a power amplifier, such as a power amplifier of a wireless microwave communication system.

If a power amplifier operates in a linear stage, the distortion is low and the efficiency is low. It is desirable that the operating point of a power amplifier is set as near the saturation point, where the amplifier output is saturated, as possible. In such a case, when the input power is increased and the amplifier output is saturated, the gain will be lowered and the power amplifier will not operate in the linear stage. The nonlinear operation will create a high distortion. The linearizer is provided to avoid such distortion and ensure power gain and reasonable efficiency of the power amplifier.

(2) Description of the Related Art

FIG. 13A and FIG. 13B are diagrams for explaining gain characteristics of power amplifiers.

FIG. 13A shows gain characteristics of single-frequency-input and multifrequency-input power amplifiers. A microwave input signal is supplied to the power amplifier of the type related to the present invention. The relationship between the input power and the power gain of each amplifier is shown in FIG. 13A. The gain of the amplifier is generally held constant with an increase of the input power until a certain limit of the input power is exceeded. Hereinafter, a range of the input power in which the gain of the subject device can be held constant is called the linear region. If the input power exceeds the limit, the gain of the amplifier will be lowered with the increase of the input power.

FIG. 13B shows a frequency distribution of input and output signals of a power amplifier. Suppose that a two-frequency input signal having frequencies "f1" and "f2" is supplied to the power amplifier. The power amplifier is subject to intermodulation due to the nonlinearity. The intermodulation causes the power amplifier to output harmonic signals, such as "2f1–f2", "3f1–2f2", "2f2–f1" and "3f2–f1", in response to the input signal.

For example, a wireless transmitter requires a power amplifier which amplifies a multi-channel transmitting signal for a number of channels. If a single-frequency-input power amplifier which deals with only a single-frequency transmitting signal is used by the wireless transmitter, a corresponding number of such power amplifiers for the number of channels must be installed. This configuration provides the gain characteristics with an increased constant region with respect to the input power, but will make the wireless transmitter expensive. To reduce the cost, a multifrequency-input power amplifier which directly amplifies a multi-channel transmitting signal, derived from a number of single-frequency transmitting signals for a number of channels, is frequently used by the wireless transmitter.

As shown in FIG. 13A, the constant region with respect to the input power in the gain characteristics of the multifrequency amplifier is narrower than that in the gain characteristics of the single-frequency amplifier. Hence, with respect to the same magnitude of the input power, the multifrequency amplifier is more likely to create distortion due to the intermodulation or the like than the single-frequency amplifier.

A linearizer which is configured to eliminate such distortion of the power amplifier is known. For example, a predistortion-type linearizer, as shown in FIG. 14, is known.

The linearizer of FIG. 14 generally has a distortion extracting module 101 and a distortion compensating module 102. The distortion extracting module 101 includes a splitter 111, a linear amplifier 112 and a distortion generating amplifier 113. The distortion compensating module 102 includes a pair of phase shifters 121 and 122, a pair of attenuators 123 and 124 and a mixer 125. An input terminal is connected to an input of the splitter 111, and an output of the mixer 125 is connected to an output terminal.

For example, when a two-frequency input signal having frequencies "f1" and "f2" is supplied to the linearizer of FIG. 14 via the input terminal, the distortion extracting module 101 is subject to intermodulation due to the nonlinearity of the amplifiers 112 and 113, similar to the above-mentioned power amplifier. The intermodulation causes each of the amplifiers 112 and 113 to output harmonic signals, such as "2f1–f2", "3f1–2f2", "2f2–f1" and "3f2–f1", in response to the input signal.

As shown in FIG. 15A, the input signal ("f1", "f2"), the harmonic signals ("2f1–f2", "3f1–2f2", "2f2–f1", "3f2–f1") and the inverted-phase harmonic signals are supplied from the distortion extracting module 101 to the distortion compensating module 102.

As shown in FIG. 15B, the harmonic signals and the inverted-phase harmonic signals are canceled each other in the distortion compensating module 102, and a two-frequency output signal having only the frequencies f1 and f2 is produced as a result of amplification of the input signal at the output of the distortion compensating module 102. In this manner, the conventional linearizer of FIG. 14 is effective in eliminating the distortion components from the output signal even when the multifrequency signal is input.

Further, as disclosed in Japanese Laid-Open Patent Application No. 57-101404, an FET-based linearizer is known. The conventional linearizer of the above publication includes a field-effect transistor (FET) having a drain connected to an input terminal, a gate connected to a bias line and a source connected to an output terminal. An input signal is supplied to the drain of the FET via the input terminal. A fixed bias voltage is supplied through the bias line to the gate of the FET. At the same time, the input signal is supplied through a variable resistor to the gate of the FET. An output signal is produced at the source of the FET as a result of amplification of the input signal, and the output signal is supplied from the source of the FET to the output terminal.

In the conventional linearizer of the above publication, the input signal is supplied through the variable resistor to the gate of the FET, in addition to the fixed bias voltage, and a bias point of the FET is shifted according to the magnitude of the input signal. Even when a large input signal is supplied to the FET, the conventional linearizer can prevent the lowering of the gain due to the increase of the input signal, and can compensate for the distortion of the output signal.

However, in the conventional linearizer of FIG. 14, the input signal is distributed to two signal processing routes. The extraction of the distortion components, and the phase matching and amplitude matching of the two signal processing routes must be carried out in order to allow the harmonic signals and the inverted-phase harmonic signals to be canceled each other. Hence, the linearizer of FIG. 14 requires a large-size signal processing circuit, and the power consumption is large. Further, the phase and amplitude matching which allows for the distortion compensation is complicated.

Further, in the conventional linearizer of the above publication, the input signal is supplied through the variable resistor to the gate of the FET, in addition to the fixed bias voltage, and a bias point of the FET is shifted according to the magnitude of the input signal. The conventional linearizer of the above publication requires an optimization of the variable resistor for compensating for the distortion of the output signal. The adjusting of the resistor for the optimization is complicated. Further, it is necessary that the conventional linearizer of the above publication be connected to a low-pass filter as the subsequent-stage device of the linearizer.

SUMMARY OF THE INVENTION

An object of the present invention is to provide an improved linearizer in which the above-mentioned problems are eliminated.

Another object of the present invention is to provide a linearizer which is configured with a simple structure and facilitates the optimization in conformity with desired gain characteristics of a power amplifier.

The above-mentioned objects of the present invention are achieved by a linearizer for a power amplifier, including: an input terminal; an output terminal; a field-effect transistor which has a gate connected to the input terminal, a drain connected to the output terminal and a source grounded; a load circuit through which a supply voltage is supplied to the drain of the transistor; a bias line through which a gate voltage is supplied to the gate of the transistor, wherein the transistor is biased at a bias point at which a drain current of the transistor in response to the gate voltage is in an unsaturated region.

In the linearizer of the present invention, an input signal is supplied from the input terminal to the gate of the transistor, and an output signal, produced at the drain of the transistor from the input signal, is delivered to the power amplifier via the output terminal. The load circuit which is constituted by either a load resistor or a second field-effect transistor is connected to the drain of the transistor, and a supply voltage is supplied through the load circuit to the drain of the transistor. A gate voltage is supplied through the bias line to the gate of the transistor. The transistor is biased at a bias point where the drain current of the transistor in response to the gate voltage is in the unsaturated region.

In the linearizer of the present invention, when an input power below a given limit is supplied, the gain of the linearizer is held constant with an increase of the input power until a given limit is exceeded. After the input power exceeds the given limit, the gain of the linearizer gradually increases with the increase of the input power. Hence, the linearizer of the present invention is effective in preventing the drop of the gain of the power amplifier when the input power is increased, and makes it possible to compensate for the distortion caused by the drop of the gain of the power amplifier. Further, the linearizer of the present invention is configured with a simple structure and effective in facilitating the optimization in conformity with desired gain characteristics of the power amplifier.

BRIEF DESCRIPTION OF THE DRAWINGS

The above and other objects, features and advantages of the present invention will become more apparent from the following detailed description when read in conjunction with the accompanying drawings in which:

FIG. 14 is a block diagram of a conventional linearizer; and

FIG. 15A and FIG. 15B are diagrams for explaining an operation of the conventional linearizer.

DETAILED DESCRIPTION OF THE PREFERRED EMBODIMENTS

A description will now be given of the preferred embodiments of the present invention with reference to the accompanying drawings.

Figure 1:
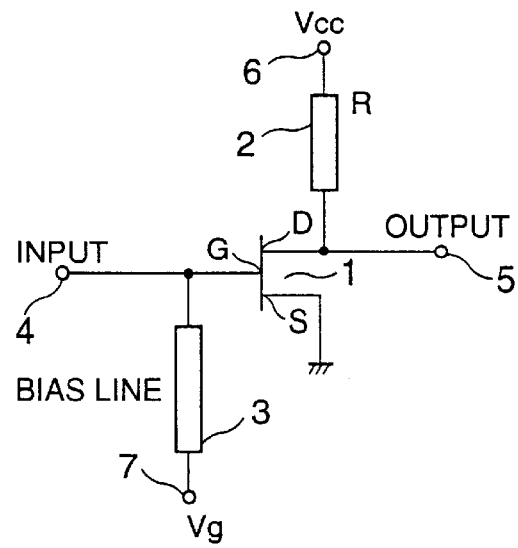
FIG. 1 is a circuit diagram of a first embodiment of a linearizer of the present invention.

FIG. 1 shows a first embodiment of a linearizer of the present invention.

As shown in FIG. 1, the linearizer of the present embodiment includes a field-effect transistor (FET) 1 which has a gate G, a source S and a drain D. A load circuit 2, which is constituted by a load resistor R in the present embodiment, is connected at one end to the drain D of the FET 1. The other end of the load circuit 2 is connected to a source terminal 6. A supply voltage Vcc is applied to the source terminal 6, and it is supplied from the source terminal 6 through the load circuit 2 to the drain D of the FET 1. A bias line 3 is connected at one end to the gate G of the FET 1. The other end of the bias line 3 is connected to a bias terminal 7. A gate voltage Vg is applied to the bias terminal 7, and it is supplied from the bias terminal 7 through the bias line 3 to the gate G of the FET 1.

In the linearizer of FIG. 1, an input terminal 4 is connected to the gate G of the FET 1, and the drain D of the FET 1 is connected to an output terminal 5. The source S of the FET 1 is grounded. A microwave input signal is supplied from the input terminal 4 to the FET 1, and an output signal, produced by the FET 1 from the input signal, is delivered to a subsequent-stage device via the output terminal 5. The linearizer of FIG. 1 is configured such that the load circuit 2 (the load resistor R) and the bias line 3 show high impedances to the microwave input signal supplied to the FET 1. The output terminal 5 is connected to a power amplifier (not shown in FIG. 1) which is the subsequent-stage device of the linearizer of the present embodiment.

Figure 2:
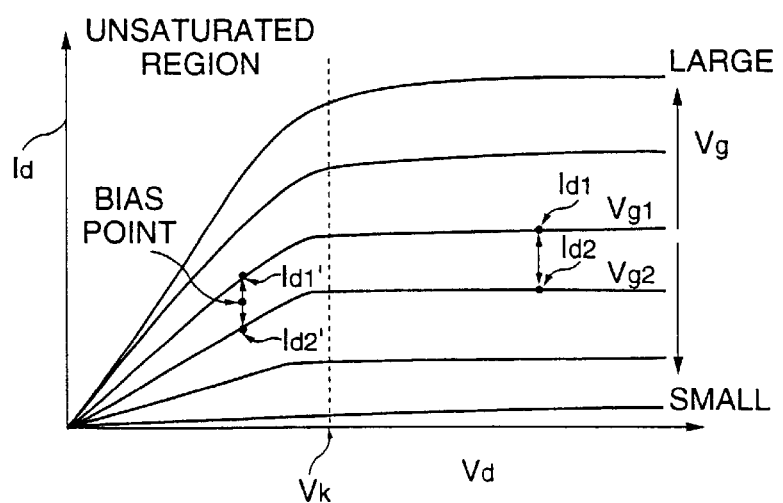
FIG. 2 is a diagram for explaining a bias point of the linearizer.

FIG. 2 shows a bias point of the linearizer of the present invention.

A number of characteristic curves, indicating the relationship between drain voltage (Vd) and drain current (Id) of the FET 1 when the gate voltage Vg varies, are shown in FIG. 2. In FIG. 2, "Vk" indicates a knee voltage for the drain voltage Vd at which the drain current Id in response to the gate voltage Vg just changes from an unsaturated region into a saturation region. Namely, the drain current Id of the FET 1 is in the unsaturated region when the drain voltage Vd is below the knee voltage Vk, and, when the drain voltage Vd is above the knee voltage Vk, it is in the saturation region. As shown in FIG. 2, the drain current Id increases with an increase of the gate voltage Vg.

Suppose that, with respect to a certain drain voltage Vd which is above the knee voltage Vk (Vd>Vk), a drain current of the FET 1 when the gate voltage Vg is set at Vg2 is indicated by "Id2", and a drain current of the FET 1 when the gate voltage Vg is increased to Vg1 (Vg1>Vg2) is indicated by "Id1". A mutual conductance Gm of the FET 1 for this case is given by $$Gm=(Id1-Id2)/(Vg1-Vg2).$$

Also, suppose that, with respect to a certain drain voltage Vd which is below the knee voltage Vk (Vd<Vk), a drain current of the FET 1 when the gate voltage Vg is set at Vg2' is indicated by "Id2'", and a drain current of the FET 1 when the gate voltage Vg is increased to Vg1' (Vg1'>Vg2') is indicated by "Id1'". A mutual conductance Gm' of the FET 1 for this case is given by $$Gm'=(Id1'-Id2')/(Vg1'-Vg2').$$

As is apparent from the indications of FIG. 2, the condition Gm>Gm' is satisfied.

In the linearizer of the present embodiment, the FET 1 is biased at a bias point at which the drain current Id of the FET 1 in response to the gate voltage Vg is in the unsaturated region. As described above with reference to FIG. 2, the larger the distance of the bias point away from the saturation region at the knee voltage Vk, the larger the difference between the mutual conductance Gm' and the mutual conductance Gm. Hence, in order to obtain a relatively large mutual conductance of the FET 1, it is advantageous that a bias point which is located as near the saturation range as possible but in the unsaturated region is selected for the linearizer. In the linearizer of the present embodiment, such a bias point is suitably selected to ensure a relatively large mutual conductance of the FET 1.

Figure 3A:
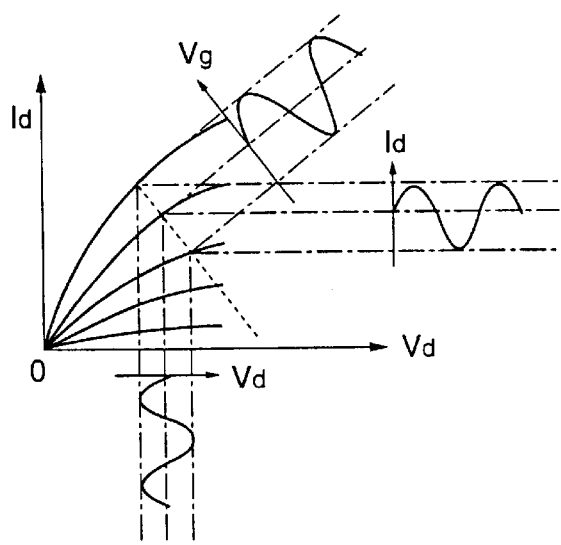
FIG. 3A and FIG. 3B are diagrams for explaining the shifting of a bias point of the linearizer.
Figure 3B:
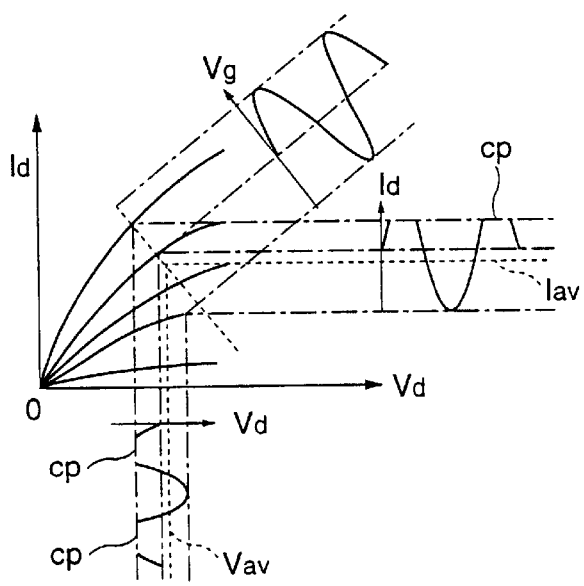

FIG. 3A and FIG. 3B are diagrams for explaining the shifting of a bias point of the linearizer of the present embodiment when an input signal power is increased.

FIG. 3A shows a bias point of the linearizer of the present embodiment when a small input power is supplied. When the input signal power is small, the gate voltage Vg supplied to the gate of the FET 1 is hardly affected by the input signal. As shown in FIG. 3A, the bias point at which the drain current Id in response to the gate voltage Vg is in the unsaturated region is fixed or unchanged. In this case, the microwave input signal is supplied from the input terminal 4 to the FET 1, and an output signal having a constant gain to the input signal is produced by the FET 1.

FIG. 3B shows a bias point of the linearizer of the present embodiment when a large input power is supplied. When the input signal power supplied to the gate of the FET 1 is increased, the gate voltage Vg at the gate of the FET 1 is also increased by the input signal. As shown in FIG. 3B, each of the negative-going part of the sine wave of the drain voltage Vd and the positive-going part of the sine wave of the drain current Id is clipped off as indicated by "cp" in FIG. 3B. Suppose that "Vav" indicates an average value of the drain voltage Vd, and "Iav" indicates an average value of the drain current Id. As shown, the average value Vav of the drain voltage and the average value Iav of the drain current are shifted from the center axis of the sine wave. Hence, in this case, the bias point of the linearizer is shifted from that of FIG. 3A to the lower right point (or the intersection between the dotted line of the average drain current Iav and the dotted line of the average drain voltage Vav in FIG. 3B). The direction of shifting of the bias point in the above case corresponds to the direction in which the gain of the FET 1 is increased.

Figure 4:
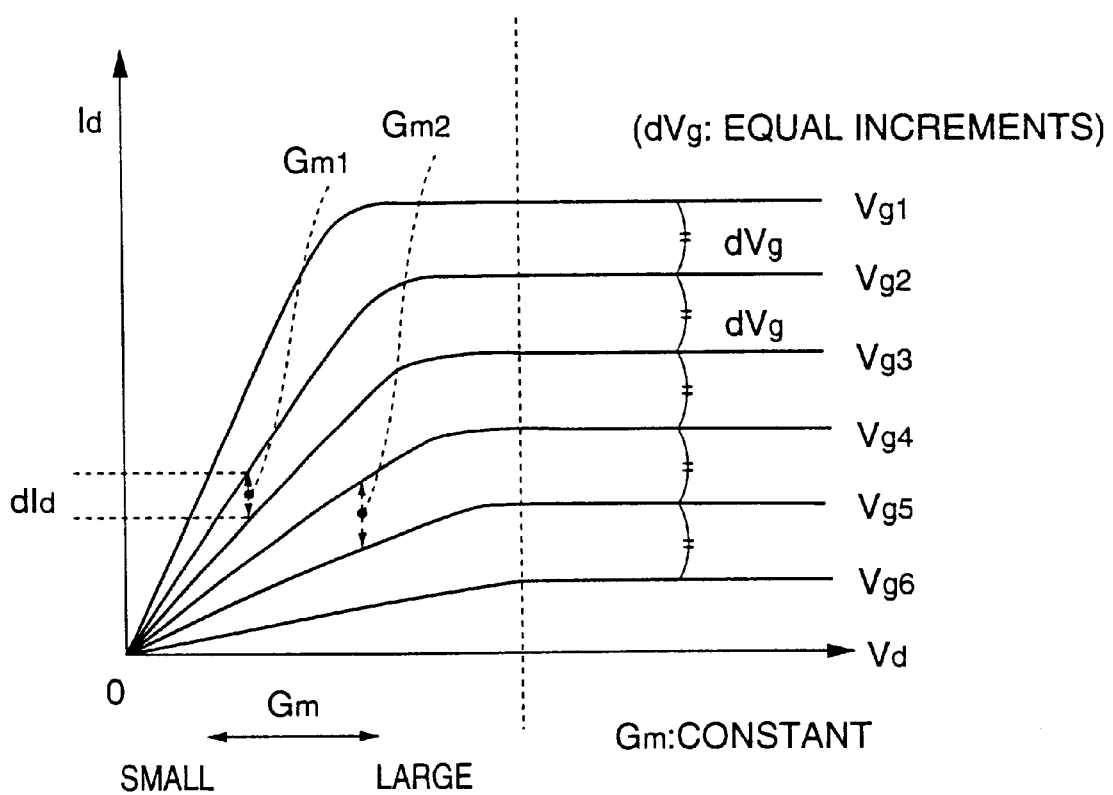
FIG. 4 is a diagram for explaining a change of a mutual conductance of the linearizer.

FIG. 4 is a diagram for explaining a change of a mutual conductance of the linearizer of the present embodiment.

A number of characteristic curves, indicating the relationship between drain voltage (Vd) and drain current (Id) of the FET 1 when the gate voltage Vg varies with equal increments, are shown in FIG. 4. In FIG. 4, "Vg6", "Vg5", "Vg4", "Vg3", "Vg2", and "Vg1" indicate respective values of the gate voltage Vg when it is increased by equal increments "dVg". As previously described, the drain current Id increases with an increase of the gate voltage Vg.

The mutual conductance Gm of the FET 1 is represented by the ratio of a change of the drain current Id (the output current) to a change of the gate voltage Vg (the input voltage). When the drain current Id is in the saturation range, the ratio of a change of the drain current Id to a change of the gate voltage Vg is constant as shown in FIG. 4. Hence, the mutual conductance Gm of the FET 1 in the linearizer of the present embodiment is constant when the drain current Id is in the saturation region.

On the other hand, when the drain current Id is in the unsaturated region, the ratio of a change of the drain current Id to a change of the gate voltage Vg increases with a decrease of the gate voltage Vg as shown in FIG. 4. Hence, the mutual conductance Gm of the FET 1 in the linearizer of the present embodiment increases with a decrease of the gate voltage Vg when the drain current Id is in the saturation region.

As described above with reference to FIG. 3B, when the input power is increased, the bias point of the linearizer is shifted in the direction toward the lower right point. The direction of shifting of the bias point corresponds to the direction in which the gate voltage Vg of the FET 1 is decreased. Hence, the mutual conductance Gm of the FET 1 in the linearizer of the present embodiment is increased due to the shifting of the bias point.

Figure 5A:
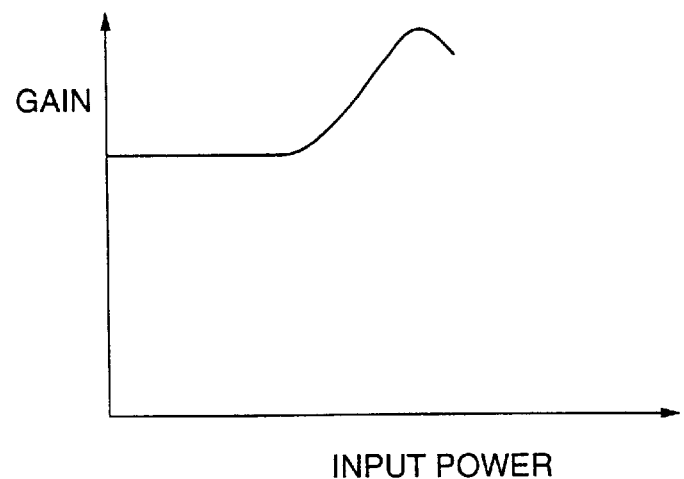
FIG. 5A and FIG. 5B are diagrams for explaining gain characteristics of the linearizer.
Figure 5B:
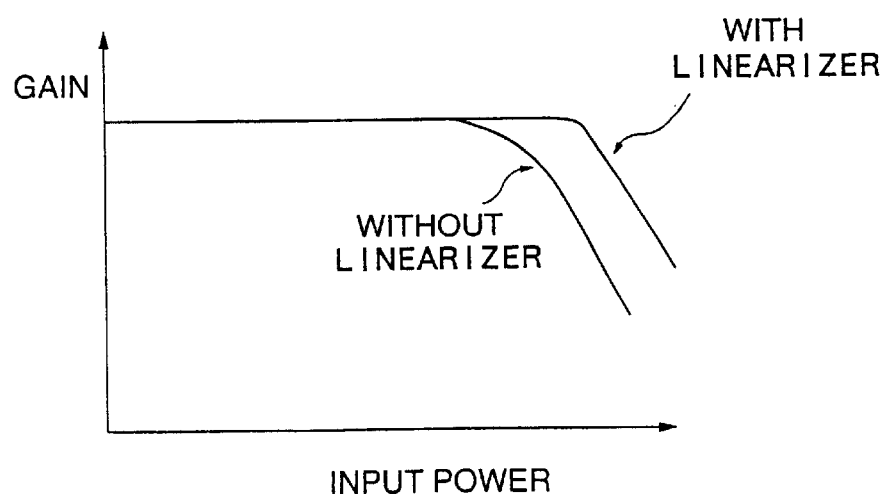

FIG. 5A and FIG. 5B are diagrams for explaining gain characteristics of the linearizer of the present embodiment.

FIG. 5A shows gain characteristics of the linearizer of the present embodiment. As shown in FIG. 5A, the gain of the linearizer is generally held constant with an increase of the input power until a given limit of the input power is exceeded. After the input power exceeds the given limit, the gain of the linearizer gradually increases with the increase of the input power until a certain distortion compensating range for the input power is exceeded. When the input power exceeds the distortion compensating range, the gain of the linearizer starts being lowered with the increase of the input power.

FIG. 5B shows both gain characteristics of a power amplifier with the linearizer of the present embodiment connected thereto and those of the power amplifier with no linearizer connected thereto. Suppose that, when no linearizer is connected, the power amplifier shows such a characteristic that the gain starts dropping from around the point of the input power where the gain of the linearizer starts increasing. As shown in FIG. 5B, when the linearizer of the present embodiment is connected to the power amplifier, the dropping of the gain of the power amplifier is prevented to a certain extent by the linearizer. The gain of the power amplifier is maintained at a high level until a certain upper limit of the input power is exceeded. In this manner, the linearizer of the present embodiment is effective in maintaining the gain of the power amplifier at a high level with a reasonable efficiency when it is connected to the power amplifier and the input power is large.

Figure 6A:
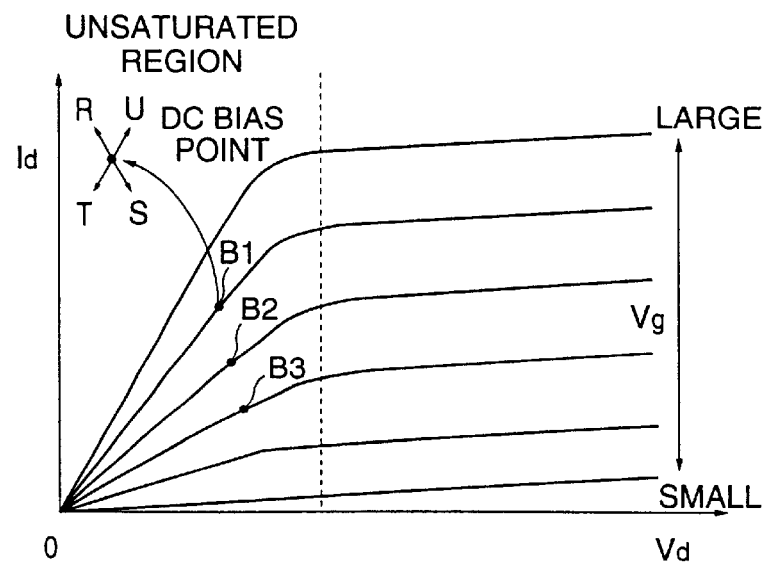
FIG. 6A and FIG. 6B are diagrams for explaining an optimization of the linearizer.
Figure 6B:
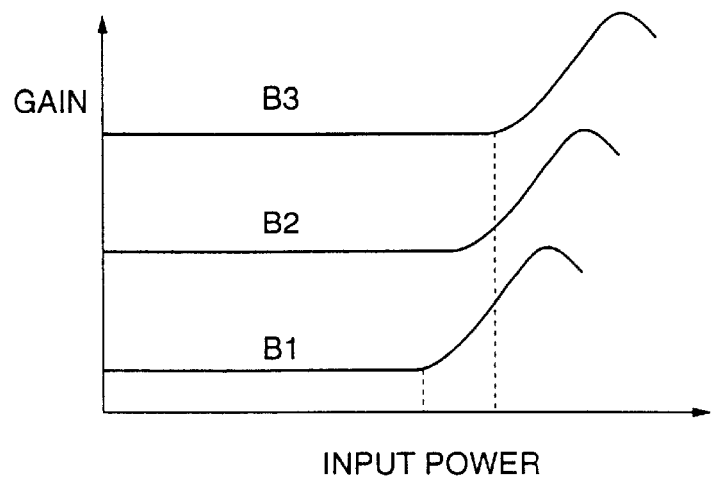

FIG. 6A and FIG. 6B are diagrams for explaining an optimization of the linearizer of the present embodiment.

As shown in FIG. 6A, suppose that a bias point B1, a bias point B2 and a bias point B3 where the drain current Id of the FET 1 is in the unsaturated region are selected in a number of characteristic curves which indicate the relationship between drain voltage (Vd) and drain current (Id) of the FET 1 when the gate voltage Vg varies. With an increase of the gate voltage Vg, the bias point of the linearizer of the present embodiment is shifted in a direction from the bias point B3 to the bias point B1. The direction of shifting of the bias point in this case corresponds to the direction indicated by the arrow "R" in FIG. 6A. The direction that is opposite to the direction of shifting of the bias point in this case is indicated by the arrow "S" in FIG. 6A.

In addition, with a decrease of the magnitude of the load resistor R of the load circuit 2 (or with an increase of the supply voltage Vcc), the bias point of the linearizer of the present embodiment is shifted in one of the directions indicated by the arrows "T" and "U" in FIG. 6A which are different from the directions "R" and "S".

As shown in FIG. 6B, the gain characteristics of the linearizer of the present embodiment vary depending on the bias point selected. The respective gain characteristic curves for the bias points B1, B2 and B3 of FIG. 6A are shown in FIG. 6B. The gain of the linearizer corresponding to the bias point B3 (the gate voltage Vg is small) is higher than the gain of the linearizer corresponding to the bias point B1 (the gate voltage Vg is large).

In addition, as shown in FIG. 6B, the point of the input power where the gain of the linearizer for the bias point B3 starts increasing is larger than the corresponding one for the bias point B1. The point of the input power where the gain of the linearizer starts increasing varies depending on the gate voltage Vg on which the bias point is selected.

Figure 7:
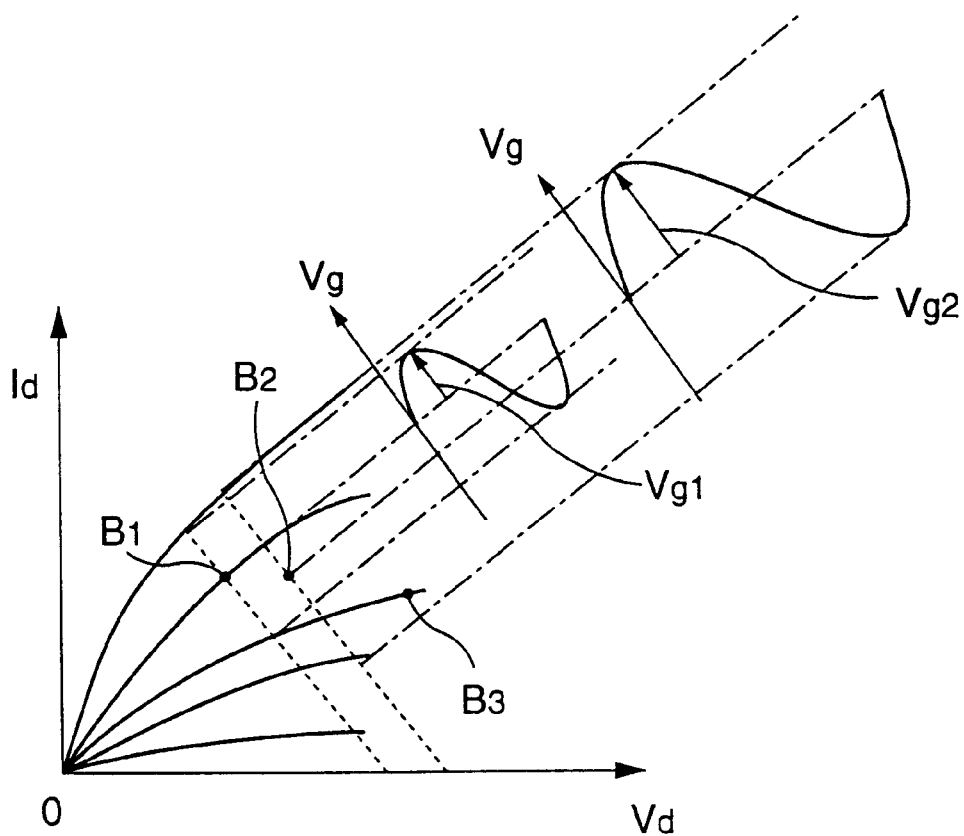
FIG. 7 is a diagram for explaining an optimization of the linearizer by setting of a bias point.

FIG. 7 is a diagram for explaining an optimization of the linearizer by setting of a bias point.

Suppose that a bias point B1 in FIG. 7 is selected. If the gate voltage Vg of the FET 1 is set at a level "Vg1", no clipping problem occurs. However, if the gate voltage Vg is further increased from the level Vg1, the clipping problem, such as that in the example of FIG. 3B, occurs. Namely, with a larger gate voltage, the peaks of the amplitude waveform of the drain voltage Vd or the peaks of the amplitude waveform of the drain current Id will be clipped. In this case, it can be determined that when the bias point B1 is selected the gate voltage level Vg1 is appropriate for the optimum linearizer.

Also, suppose that a bias point B2 in FIG. 7 is selected. If the gate voltage Vg is set at a higher level "Vg2" (Vg2>Vg1), no clipping problem occurs. However, if the gate voltage Vg is further increased from the level Vg2, the clipping problem occurs. Namely, with a larger gate voltage, the peaks of the amplitude waveform of the drain voltage Vd or the peaks of the amplitude waveform of the drain current Id will be clipped. In this case, it can be determined that when the bias point B2 is selected the gate voltage level Vg2 is appropriate for the optimum linearizer.

By selecting one of the bias points B1, B2 and B3, it is possible to determine the point of the input power at which the peaks of the amplitude waveform of the drain current Id or the drain voltage Vd are clipped.

The selection of a bias point appropriate for the desired characteristics of the power amplifier as the subsequent-stage device of the linearizer is carried out. After the selection of such appropriate bias point is carried out, the optimization of the linearizer can be achieved in the above-mentioned manner. In this regard, such appropriate bias point of the FET 1 is selectable by adjusting of at least one of the gate voltage Vg, the supply voltage Vcc and the load circuit 2.

Figure 8:
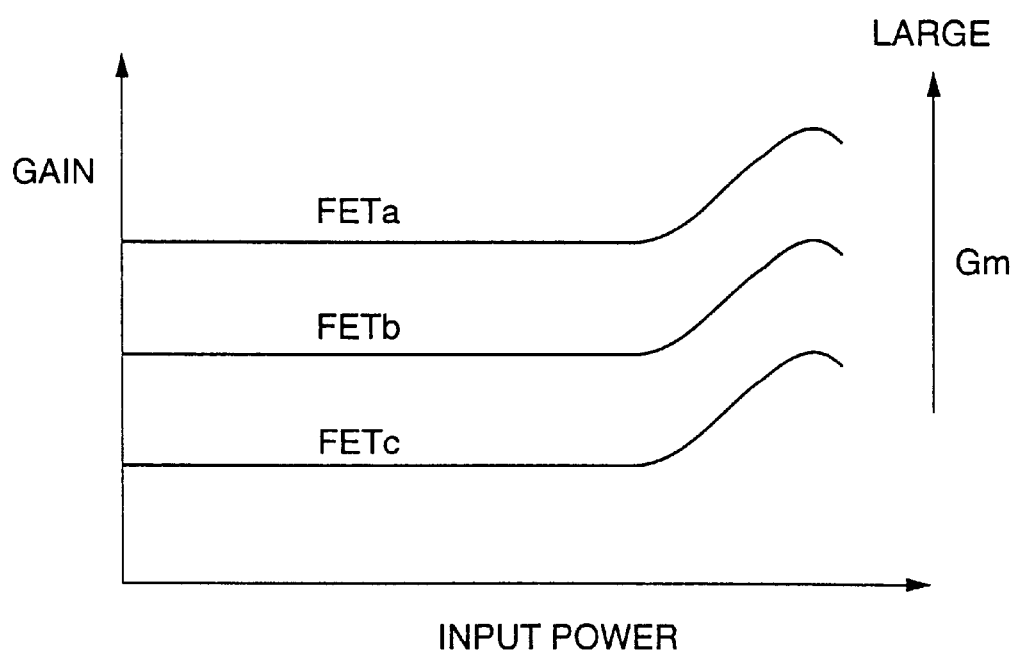
FIG. 8 is a diagram for explaining an optimization of the linearizer by selection of field-effect transistor characteristics.

FIG. 8 is a diagram for explaining an optimization of the gain characteristics by selection of field-effect transistor (FET) characteristics.

Generally, the characteristics of field-effect transistors vary depending on the type, the model and other factors of that FET. Suppose that respective gain characteristic curves FETa, FETb and FETc for three different field-effect transistors are shown in FIG. 8. By selection of one of the gain characteristics FETa, FETb and FETc appropriate for the desired characteristics of the power amplifier as the subsequent-stage device of the linearizer, an optimization of the linearizer can be easily achieved.

Figure 9A:
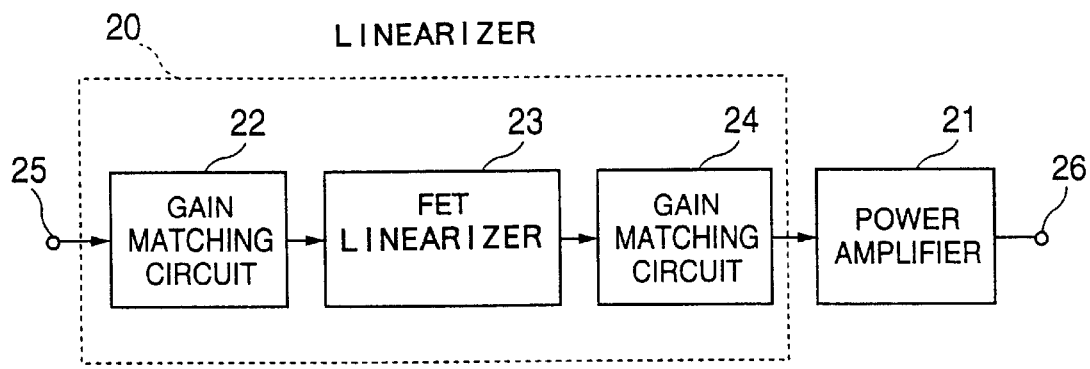
FIG. 9A and FIG. 9B are diagrams for explaining an optimization of the linearizer by adjusting of a gain matching circuit.
Figure 9B:
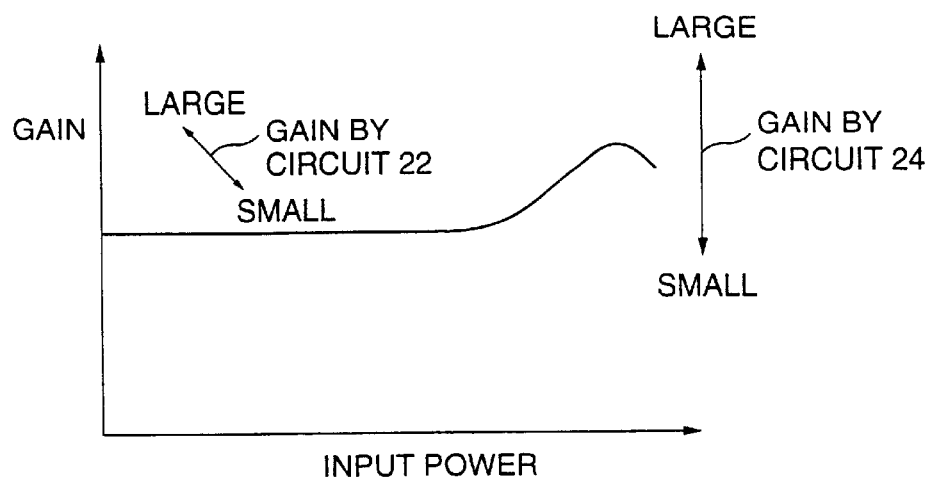

FIG. 9A and FIG. 9B are diagrams for explaining an optimization of the linearizer by adjusting of a gain matching circuit.

FIG. 9A shows a linearizer 20 embodying the present invention which is connected to a power amplifier 21. The linearizer 20 of the present embodiment includes a gain matching circuit 22, an FET linearizer 23, and a gain matching circuit 24 which are connected in series as shown in FIG. 9A. The FET linearizer 23 may be constituted by the linearizer of FIG. 1. An input terminal 25 is connected to an input of the gain matching circuit 22. The gain matching circuit 24 is connected at its output to the power amplifier 24. The power amplifier 21 is connected at its output to an output terminal 26. An optimization of the linearizer 28 is achieved by adjusting of the gain matching circuits 22 and 24.

FIG. 9B shows a gain characteristic curve of the linearizer 20 of the present embodiment which is shifted by adjusting of the gain matching circuits 22 and 24. When the gain of the gain matching circuit 22 is adjusted, the gain characteristic curve of the linearizer 20 is shifted in one of the left-upward and right-downward directions indicated by the left-side arrows in FIG. 9B. For example, when the gain of the gain matching circuit 22 is raised, the gain characteristic curve of the linearizer 20 is shifted in the left-upward direction. In this case, the point of the input power on the gain characteristic curve where the gain of the linearizer 20 starts increasing is shifted to a new point of a smaller input power.

Further, in the linearizer 20, when the gain of the gain matching circuit 24 is adjusted, the gain characteristic curve of the linearizer 20 is shifted in one of the upward and downward directions indicated by the right-side arrows in FIG. 9B. Accordingly, by adjusting of the gain matching circuits 22 and 24 in conformity with the desired characteristics of the power amplifier 21 as the subsequent-stage device, an optimization of the linearizer 20 can be easily achieved.

Figure 10:
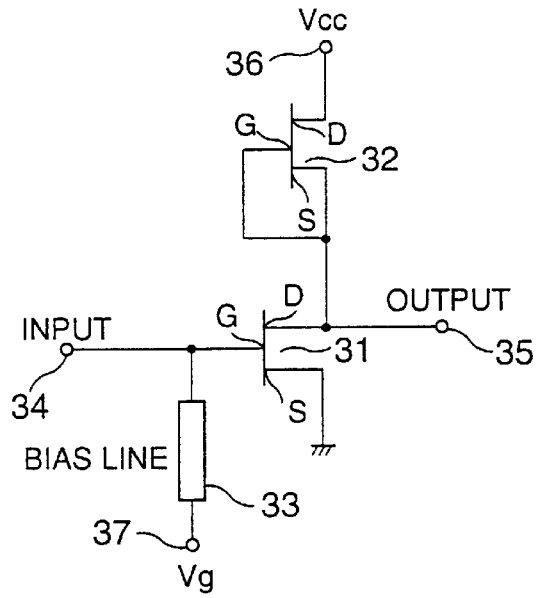
FIG. 10 is a circuit diagram of a second embodiment of the linearizer of the present invention.

FIG. 10 shows a second embodiment of the linearizer of the present invention.

As shown in FIG. 10, the linearizer of the present embodiment includes a field-effect transistor (FET) 31 which has a gate G, a source S and a drain D. A load circuit 32 is constituted by a second field-effect transistor (FET) in the present embodiment. The second FET 32 has a source S connected to the drain D of the FET 31, a drain D connected to a source terminal 36, and a gate G connected to the source S of the FET 32. A supply voltage Vcc is applied to the source terminal 36, and it is supplied from the source terminal 36 through the second FET 32 to the drain D of the FET 31. A bias line 33 is connected at one end to the gate G of the FET 31. The other end of the bias line 33 is connected to a bias terminal 37. A gate voltage Vg is applied to the bias terminal 37, and it is supplied from the bias terminal 37 through the bias line 33 to the gate G of the FET 31.

In the linearizer of FIG. 10, an input terminal 34 is connected to the gate G of the FET 31, and the drain D of the FET 31 is connected to an output terminal 35. The source S of the FET 31 is grounded. A microwave input signal is supplied from the input terminal 34 to the FET 31, and an output signal, produced by the FET 31 from the input signal, is delivered to the subsequent-stage device (a power amplifier) via the output terminal 35.

In the present embodiment, the second FET 32 is used as the load circuit, instead of the load circuit 2 (the load resistor) of FIG. 1. The setting of a bias point and the optimization for the FET 31 can be easily carried out in a manner similar to the embodiment of FIG. 1. The linearizer of the present embodiment is effective in facilitating the optimization in conformity with desired gain characteristics of the power amplifier.

Figure 11:
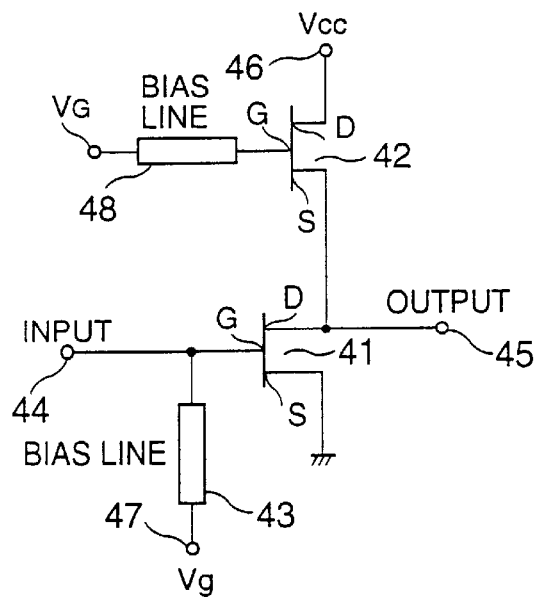
FIG. 11 is a circuit diagram of a third embodiment of the linearizer of the present invention.

FIG. 11 shows a third embodiment of the linearizer of the present invention.

As shown in FIG. 11, the linearizer of the present embodiment includes a field-effect transistor (FET) 41 which has a gate G, a source S and a drain D. A load circuit 42 is constituted by a second field-effect transistor (FET) in the present embodiment. The second FET 42 has a source S connected to the drain D of the FET 41, a drain D connected to a source terminal 46, and a gate G connected to a bias line 48. A supply voltage Vcc is applied to the source terminal 46, and it is supplied from the source terminal 46 through the second FET 42 to the drain D of the FET 41. A bias line 43 is connected at one end to the gate G of the FET 41. The other end of the bias line 43 is connected to a bias terminal 47. A gate voltage Vg is applied to the bias terminal 47, and it is supplied from the bias terminal 47 through the bias line 43 to the gate G of the FET 41. Further, a second gate voltage $V_G$ is supplied through the bias line 48 to the gate G of the second FET 42.

In the linearizer of FIG. 11, an input terminal 44 is connected to the gate G of the FET 41, and the drain D of the FET 41 is connected to an output terminal 45. The source S of the FET 41 is grounded. A microwave input signal is supplied from the input terminal 44 to the FET 41, and an output signal, produced by the FET 41 from the input signal, is delivered to the subsequent-stage device (a power amplifier) via the output terminal 45.

In the present embodiment, the second gate voltage $V_G$ is supplied through the bias line 48 to the gate G of the second FET 42, and the adjusting of the load impedance of the load circuit 42 can be easily carried out by the second gate voltage $V_G$ connected through the bias line 48. The linearizer of the present embodiment is effective in facilitating the optimization in conformity with desired gain characteristics of the power amplifier.

Figure 12A:
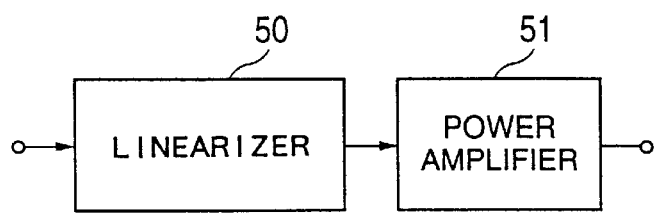
FIG. 12A and FIG. 12B are diagrams showing connections of a linearizer embodying the present invention and a power amplifier which is the subsequent-stage device.
Figure 12B:
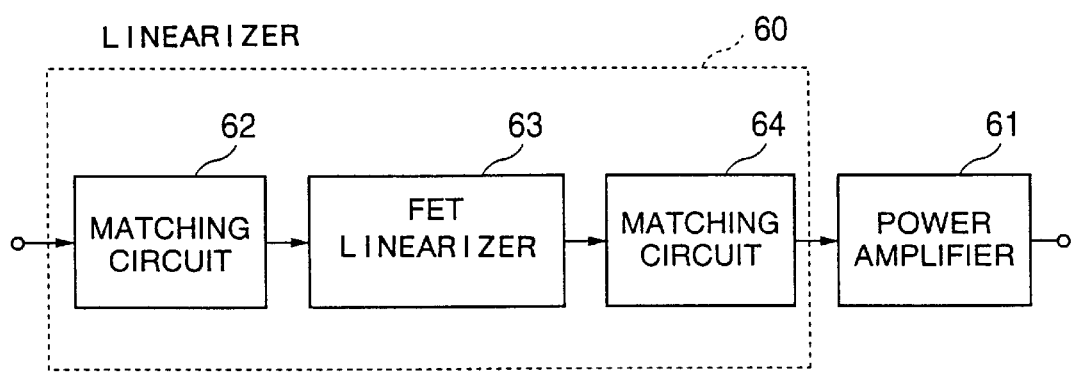
Figure 13A:
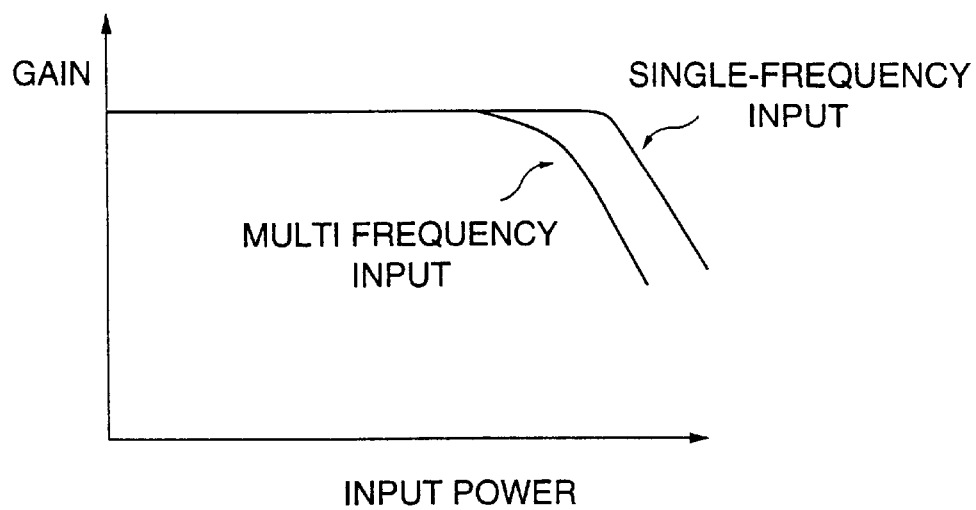
FIG. 13A and FIG. 13B are diagrams for explaining gain characteristics of power amplifiers.
Figure 13B:
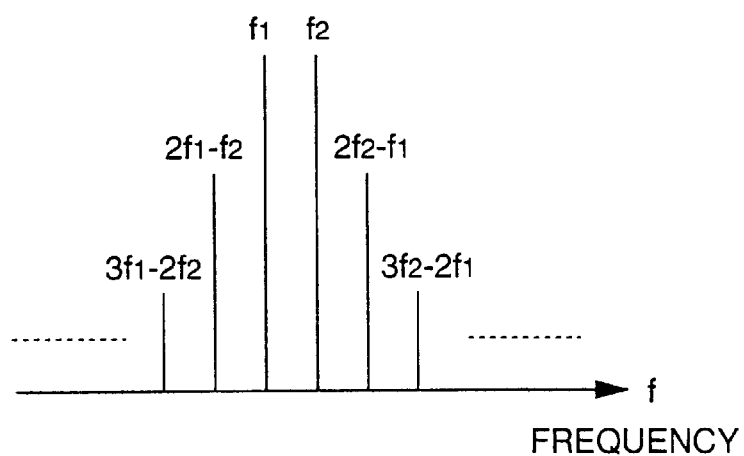

FIG. 12A and FIG. 12B show connections of the linearizer embodying the present invention and the power amplifier which is the subsequent-stage device.

FIG. 12A shows a connection of a linearizer 50 embodying the present invention and a power amplifier 51. The power amplifier 51 is the subsequent-stage device of the linearizer 50. The linearizer 50 acts to compensate for the distortion caused by the drop of the gain of the power amplifier 51.

FIG. 12B shows a connection of a linearizer 60 embodying the present invention and a power amplifier 61. The power amplifier 61 is the subsequent-stage device of the linearizer 60. The linearizer 60 includes a matching circuit 62, an FET linearizer 63 and a matching circuit 64, which are connected in series as shown in FIG. 12B.

In the linearizer 60 of FIG. 12B, the matching circuits 62 and 64 may be constituted by a known configuration of a microwave processing circuit, and the FET linearizer 63 may be constituted by, for example, the linearizer of FIG. 1. The linearizer 60 can provide a suitable broadband characteristic in amplifying a multifrequency microwave signal. The linearizer 60 acts to compensate for the distortion caused by the drop of the gain of the power amplifier 61.

The present invention is not limited to the above-described embodiments, and variations and modifications may be made without departing from the scope of the present invention.

Further, the present invention is based on Japanese priority application No. 11-023,405, filed on Feb. 1, 1999, the entire contents of which are hereby incorporated by reference.

What is claimed is:

1. A linearizer for a power amplifier of a microwave communication system, comprising:

an input terminal;

an output terminal;

a field-effect transistor having a gate connected to the input terminal, a drain connected to the output terminal and a source grounded;

a load circuit through which a supply voltage is supplied to the drain of the transistor;

a bias line through which a gate voltage is supplied to the gate of the transistor;

wherein the transistor is biased at a bias point at which a drain current of the transistor in response to the gate voltage is in an unsaturated region, and with an increase of the gate voltage, the bias point of the transistor is shiftable from a first level to a second level such that the drain current for the second level is increased from the drain current for the first level.

2. The linearizer of claim 1, wherein a bias point of the transistor appropriate for characteristics of the power amplifier is selectable by adjusting of the gate voltage supplied to the gate of the transistor.

3. The linearizer of claim 1, wherein a bias point of the transistor appropriate for characteristics of the power amplifier is selectable by adjusting of the supply voltage supplied to the drain of the transistor.

4. The linearizer of claim 1, wherein a bias point of the transistor appropriate for characteristics of the power amplifier is selectable by adjusting of the load circuit connected to the drain of the transistor.

5. The linearizer of claim 1, wherein a bias point of the transistor appropriate for characteristics of the power amplifier is selectable by adjusting of at least one of the gate voltage, the supply voltage and the load circuit.

6. The linearizer of claim 1, wherein the load circuit is constituted by a load resistor.

7. A linearizer for a power amplifier of a microwave communication system, comprising:

an input terminal;

an output terminal;

a field-effect transistor having a gate connected to the input terminal, a drain connected to the output terminal and a source grounded;

a load circuit through which a supply voltage is supplied to the drain of the transistor;

a bias line through which a gate voltage is supplied to the gate of the transistor;

wherein the transistor is biased at a bias point at which a drain current of the transistor in response to the gate voltage is in an unsaturated region, wherein the load circuit includes a second field-effect transistor, the second field-effect transistor having an adjustable gate voltage, the supply voltage being supplied through the second field-effect transistor to the drain of the field-effect transistor, and with an increase of the gate voltage, the bias point of the transistor is shiftable from a first level to a second level such that the drain current for the second level is increased from the drain current for the first level.

8. The linearizer of claim 1, wherein the linearizer includes at least one of a first gain matching circuit connected to the input terminal and a second gain matching circuit connected to the output terminal.

9. A linearizer for a power amplifier of a microwave communication system, comprising:

an input terminal;

an output terminal;

a single field-effect transistor having a gate connected to the input terminal, a drain connected to the output terminal and a source grounded;

a load circuit through which a supply voltage is supplied to the drain of the transistor;

a bias line through which a gate voltage is supplied to the gate of the transistor;

wherein the single field-effect transistor is biased at a bias point where a drain current of the transistor in response to the gate voltage is in an unsaturated region, and with an increase of the gate voltage, the bias point of the transistor is shiftable from a first level to a second level such that the drain current for the second level is increased from the drain current for the first level.

* * * * *